United States Patent
Rayssac et al.

(10) Patent No.: US 7,544,265 B2
(45) Date of Patent: Jun. 9, 2009

(54) METHOD OF FABRICATING A RELEASE SUBSTRATE

(75) Inventors: Olivier Rayssac, Grenoble (FR); Pierre Rayssac, legal representative, Grenoble (FR); Gisele Rayssac, legal representative, Grenoble (FR); Takeshi Akatsu, St. Nazaire les Eymes (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 234 days.

(21) Appl. No.: 11/481,696

(22) Filed: Jul. 5, 2006

(65) Prior Publication Data
US 2007/0077729 A1    Apr. 5, 2007

Related U.S. Application Data

(63) Continuation of application No. PCT/IB2005/000347, filed on Jan. 24, 2005.

(30) Foreign Application Priority Data
Jan. 26, 2004    (FR) ................................. 04 00694

(51) Int. Cl.
*B44C 1/17*      (2006.01)
*B29C 37/02*     (2006.01)
*B29C 35/02*     (2006.01)
*B32B 37/06*     (2006.01)
*B32B 37/02*     (2006.01)
*B32B 38/18*     (2006.01)
*H01L 21/322*    (2006.01)
*H01L 21/324*    (2006.01)
*H01L 21/304*    (2006.01)
*B44C 1/22*      (2006.01)
*B32B 37/16*     (2006.01)
*B32B 38/08*     (2006.01)
*B32B 38/10*     (2006.01)
*H01L 21/42*     (2006.01)

(52) U.S. Cl. .................... 156/239; 156/235; 156/272.2; 117/915; 438/33; 438/455; 438/473; 438/474; 438/475; 438/476

(58) Field of Classification Search ................ 156/235, 156/239, 268, 272.2; 117/915; 438/33, 455, 438/473–476
See application file for complete search history.

(56) References Cited

U.S. PATENT DOCUMENTS 6,100,165 A * 8/2000 Sakaguchi et al. .......... 438/455

(Continued)

OTHER PUBLICATIONS

M. Zacharias et al., "Size-Controlled Highly Luminescent Silicon Nanocrystals: A SiO/$SiO_2$ Superlattice Approach", Applied Physics Letters, vol. 80, No. 4, pp. 661-663 (2002).

*Primary Examiner*—Philip C Tucker
*Assistant Examiner*—Sonya Mazumdar
(74) *Attorney, Agent, or Firm*—Winston & Strawn LLP

(57) ABSTRACT

The invention relates to a method of fabricating a release substrate produced from semiconductor materials, the method comprising creating a reversible connection between two substrate release layers characterized in that the reversible connection is formed by a connecting layer produced using a first material as the basis, the connecting layer further comprising a nanoparticle concentrating zone of a second material disposed to facilitate release of the substrate, the first and second materials being selected to maintain the bonding energy of the reversible connection substantially constant even when the substrate is exposed to heat treatment.

20 Claims, 4 Drawing Sheets

U.S. PATENT DOCUMENTS

| | | | |
|---|---|---|---|
| 6,331,475 B1 * | 12/2001 | Yamazaki et al. | 438/479 |
| 6,339,010 B2 * | 1/2002 | Sameshima | 438/458 |
| 6,352,909 B1 | 3/2002 | Usenko | 438/458 |
| 6,613,678 B1 * | 9/2003 | Sakaguchi et al. | 438/695 |
| 2001/0016399 A1 | 8/2001 | Linn et al. | 438/455 |
| 2002/0153563 A1 | 10/2002 | Ogura | 257/347 |
| 2003/0008475 A1 | 1/2003 | Cheung et al. | 438/455 |
| 2004/0222500 A1 | 11/2004 | Aspar et al. | 257/629 |

* cited by examiner

METHOD OF FABRICATING A RELEASE SUBSTRATE

CROSS-REFERENCE TO RELATED APPLICATIONS

This application is a continuation of International application PCT/IB2005/000347 filed Jan. 24, 2005, the entire content of which is expressly incorporated herein by reference thereto.

BACKGROUND ART

The present invention relates to a method of fabricating a release substrate produced from semiconductor materials.

The term "release substrate" means a substrate comprising two layers which have been associated together via a reversible connection, the connection between the two layers being breakable, typically by mechanical action. Thus, the action of breaking the connection between these layers corresponds to "releasing" the substrate.

Methods of releasing a substrate are already known. As an example, the fabrication of release substrates by bonding two layers is known, where the bonding conditions are defined so that the bonding energy remains limited and for this reason, the bonding is reversible under the effect of mechanical action.

U.S. patent application 2004/0222500 provides an example of such release substrates. The "energy" associated with a bonded interface, or more generally, with a releasing interface of a release substrate, is defined as corresponding to a cohesive force between the two layers defining that interface. That energy is generally characterized by mechanical resistance:

resistance to separating the two layers—typically under the effect of inserting a wedge attacking the interface, and/or resistance to delamination (applying tension to one of the two layers defining the interface, and measuring the tensile stress corresponding to the onset of delamination).

In many applications, treatments (for example anneal type heat treatments) have to be carried out on the release substrate prior to releasing it. It is known that heat treatment tends to increase the energy (i.e. the cohesive force) of a bonding interface between two layers. This is shown in prior art documents such as U.S. patent applications 2001/0016399 or 2003/0008475 or U.S. Pat. No. 6,352,909 which disclose heat treatments either for providing a gettering layer in the wafer or for enhancing the quality of the bonding interface in a wafer made from bonded substrates.

One problem which arises with such release substrates is that any treatments (in particular heat treatments) which are to be carried out on the release substrate prior to release may compromise the reversible nature of the "release" bond of the substrate, rendering release problematical. Certain heat treatments can weaken the bond so that release occurs when not desired, while others can actually strengthen the bond making it more difficult to release the substrates when desired. These problems are not limited to release substrates in which the reversible connection is constituted by bonding. In general, applying an anneal type heat treatment to release substrates having a reversible connection that has been formed using any technique (bonding, and other techniques—for example, creating a porous region, etc) risks modifying the energy associated with the reversible connection of the substrate so that release does not occur when desired. This is a problem which is now solved by the present invention.

SUMMARY OF THE INVENTION

The present invention now provides for the production of release substrates which, prior to releasing, can undergo treatments (for example, anneal type heat treatments) without substantially affecting the energy of the reversible connection of the release substrate. In particular, the invention provides a method of fabricating a release substrate of semiconductor materials, by forming a reversible connection between two substrate release layers by providing a connecting layer of a first material, and providing a concentrated zone of nanoparticles of a second material in the connecting layer to facilitate release of the substrate release layers. With this method, the connecting layer has a bonding energy that is substantially constant even when the release substrate is exposed to heat treatments to facilitate the release of the substrate release rates when desired and not at other times.

The connecting layer can be formed by a number of ways as set forth in the following detailed description. The segregation heat treatment is carried out at a temperature on the order of 900° C. to 1100° C. for a sufficient time to form the nanoparticles and optionally in an inert atmosphere of nitrogen, argon or mixtures thereof.

BRIEF DESCRIPTION OF THE DRAWINGS

Other aspects, benefits and advantages of the present invention become clear from the following description of the invention, made with reference to the accompanying drawings in which.

DETAILED DESCRIPTION OF THE PREFERRED EMBODIMENTS

Figure 1:
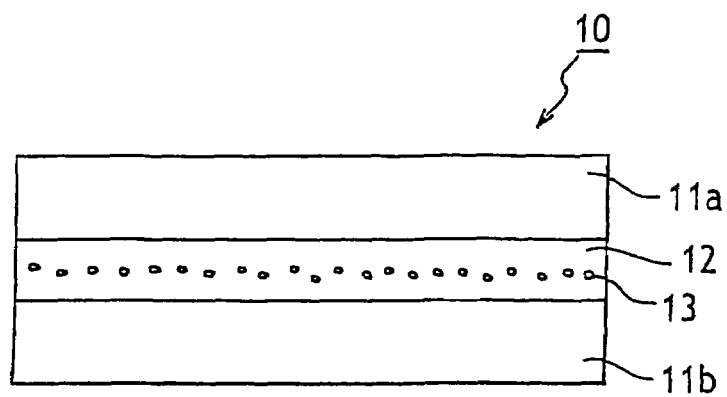
FIG. 1 is a schematic diagram showing a release substrate fabricated in accordance with the invention.

The invention thus provides a method which specifically aims at fabricating a release substrate comprising two layers connected through a reversible connection. This method preferably comprises forming the reversible connection by a connecting layer obtained from a first material, with the connecting layer further comprising a concentrating zone of nanoparticles of a second material disposed to facilitate release of the substrate. The first and second materials are selected to maintain the energy associated with the reversible connection substantially constant even when the substrate is exposed to heat treatment to facilitate release.

Preferred but non-limiting aspects of the method of the invention are as follows:

the connecting layer is formed by carrying out the following operations:

creating an initial layer produced from the first material;
creating in the initial layer an enriched region of an enrichment material, which may be the second material or a precursor for the second material;
heat treating the enriched region to cause segregation of nanoparticles within the first material;
the enriched region is produced by implanting the enrichment material into the initial layer;
production of the connecting layer involves the following steps (without limitation to the order in which the steps are carried out):
forming an elemental layer, termed the enriched layer, from an enrichment material which may be the second material or a precursor for the second material;
heat treating the enriched layer to cause segregation of nanoparticles within the first material;
to form the connecting layer, a layer termed the "first elemental layer" also formed from the first material is formed beneath the enriched layer, the enriched layer then corresponding to a layer termed the "second elemental layer";
the second elemental layer is produced by deposition onto the first elemental layer;
the first elemental layer is produced by deposition onto a first substrate release layer;
the first elemental layer is produced on a first substrate release layer by thermal oxidation;
to form the connecting layer, a layer termed the "third elemental layer" also formed from the first material is formed on the surface of the enriched layer;
the third elemental layer is produced by deposition onto the enriched layer;
the third elemental layer is produced by thermal oxidation of a portion of the material of the enriched layer;
the thickness of the enriched layer is gauged so that a portion of the material of the layer can be used to form the third elemental layer;
the third elemental layer is formed on the second release layer prior to assembling the second release layer with the connecting layer;
the third elemental layer is produced by thermal oxidation of the second substrate release layer prior to assembling the second release layer with the remainder of the connecting layer;
the segregation heat treatment is carried out at a temperature of the order of 900° C. to 1100° C. for a sufficient time of about 25 to 95 minutes to provide the nanoparticles and preferably in an inert atmosphere of nitrogen, argon or mixtures thereof;
the connecting layer is created on a first of the two substrate release layers, and the second release layer is formed on the connecting layer after the segregation heat treatment step;
the connecting layer is created on a first of the two substrate release layers, and the second release layer is formed on the connecting layer after creating an enriched region in the connecting layer and before the segregation heat treatment step;
the first release layer is formed beneath the connecting layer by means of a transfer technique;
the transfer technique is a SMART-CUT® type technique;
the second release layer is formed on the connecting layer by means of a transfer technique;
the transfer technique is a SMART-CUT® type technique;
the first material may be $SiO_2$;
the second material may be Si;
the enrichment material may be SiO;
the second material may be Ge.

Before embarking on the detailed description of the drawings, it should be noted that FIGS. 1, 2a to 2c, 3a to 3d are diagrammatic representations which are not to scale, but which illustrate the principles of the invention.

FIG. 1 shows a release substrate 10 fabricated in accordance with the invention. The release substrate comprises:
two layers 11a, 11b which correspond to two layers which can be detached. These two layers are termed below "substrate release layers". The layers may be formed from a semiconductor material such as silicon;
a connecting layer 12 which acts as a reversible connection between the layers 11a, 11b for the release substrate 10. The connecting layer 12 is produced from a "first material", for example a material such as $SiO_2$;
particles 13 should also be noted at the core of the connecting layer 12, which particles correspond to nanoparticles, as shall be seen. The nanoparticles 13 are organized into a zone of concentration within the first material which facilitates release of the substrate 10 at the connecting layer 12;
the nanoparticles 13 are produced from a "second material" which differs from the "first material" mentioned above. As an example, it may be Si or Ge when the first material is $SiO_2$.

It should be emphasized that the term "nanoparticles" as used here means particles of very small size—on the order of a few nanometers (nm) to a few tens of nanometers. In one application of the invention, the diameter of the nanoparticles is typically of the order of 1 nm to 10 nm. The "zone of concentration" of the nanoparticles corresponds to a zone in which the majority of nanoparticles are concentrated.

It should be pointed out that in general, it is possible to produce the release layers 11a, 11b from any semiconductor material. In the same manner, the layer 12 and the nanoparticles 13 can be produced from a material that differs from those mentioned above. In any event, the material of the nanoparticles 13 ("second material") is different from the material of the connecting layer 12 ("first material"). The two materials are selected to ensure that the mechanical properties of the connecting layer 12 are stable when the substrate 10 undergoes a heat treatment prior to detaching (this aspect is described in more detail below).

The connecting layer 12 is formed:
by creating a layer, termed the initial layer, in the first material, which forms the basis for the connecting layer 12 ($SiO_2$ in the present example);
the initial layer may be created directly on the layer 11b, for example by deposition or thermal oxidation;
by forming a region 120 termed the enriched region in the thickness of the initial layer;
to this end, a region comprising a material termed the enrichment material is formed in the thickness of the layer 12;
the material may be the second material mentioned above corresponding to the nanoparticle material, or a precursor for the second material. The term "precursor" for the second material means a material that can produce the second material after a suitable heat treatment. In the case in which the second material is Si, the precursor is typically SiO or $SiO_2$;
by carrying out a heat treatment on the enriched region 120 (or 122 as can be seen in the second implementation of the invention) to cause nanoparticles of the second material to segregate within the layer 12 based on the first material;

at the end of this heat treatment, the second release layer 11a may be formed, covering the connecting layer 12, to finalize fabrication of the release substrate 10.

In all of the implementations of the invention, the layer 11a may also be formed after creating the enriched region 120 but before heat treating the enriched region 120 to cause nanoparticle segregation therein. It should be pointed out that the segregation process is described in more detail below, more particularly with reference to FIGS. 4a, 4b and 5.

Figure 2A:
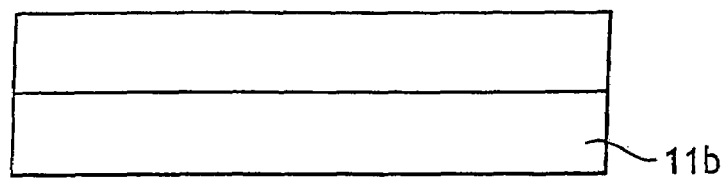
FIGS. 2a to 2c diagrammatically show three steps for producing the release substrate in accordance with a first implementation of the invention.
Figure 2B:
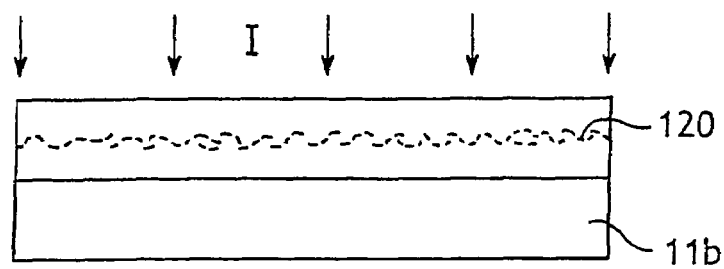
Figure 2C:
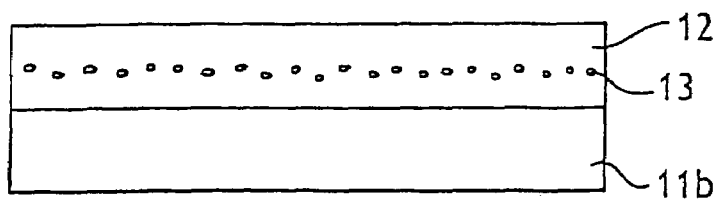

FIGS. 2a to 2c show the principal steps employed in the invention in accordance with a first implementation. FIG. 2a shows the formation of an initial layer of $SiO_2$ on a layer 11b of silicon, for example by deposition of $SiO_2$ or thermal oxidation of Si.

FIG. 2b shows one manner of enriching the initial layer. In this implementation, enrichment is achieved by implantation I into the initial layer covering the layer 11b. The implanted species corresponds to the second material mentioned above, or to a precursor for the second material. Thus, for example, it may be silicon or germanium. At the end of the implantation, the implanted species (silicon atoms, for example) are distributed in a substantially regular manner and aggregated to a greater or lesser extent within the thickness of the initial layer of $SiO_2$.

The structure shown in FIG. 2b then undergoes segregation heat treatment. In this implementation, as in the other implementations of the invention, the segregation heat treatment may be carried out at a temperature on the order of 900° C. to 1100° C. It should be recalled that the segregation heat treatment is explained in more detail below. At the end of the segregation heat treatment, a structure such as that shown diagrammatically in FIG. 2c is obtained. The segregation heat treatment causes segregation of the implanted species (for example silicon), forming the nanoparticles. After covering the structure with a second release layer 11a (for example by deposition of the desired material or by bonding the layer thereto), a release substrate of the type shown in FIG. 1 is obtained.

FIGS. 3a to 3d show steps in accordance with a second implementation of the invention. In this implementation, the connecting layer is formed by producing successive different elemental layers in the substrate release layer 11b. It should be noted that in a variation, it is possible to provide just one "elemental layer" (in this case, the single elemental layer is the layer 122—see below).

In this second implementation, the elemental layers (or the elemental layer 122 in the case in which only a single elemental layer is used) form the connecting layer of the substrate on the release layer 11b. In this implementation, as in all of the implementations of the invention, the other release layer 11a is then assembled with the connecting layer—for example by transferring the layer 11a to the connecting layer, by bonding. It should, however, be pointed out that, in all of the implementations of the invention, it is also possible to form the second release layer directly on the connecting layer (by deposition, or by any other known technique for producing the layer).

Figure 3A:
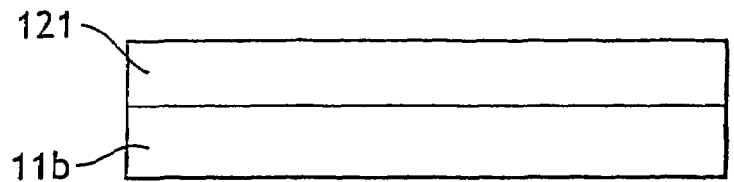
FIGS. 3a to 3d diagrammatically show four steps for producing the release substrate in accordance with a second implementation of the invention.

FIG. 3a shows the formation of a first elemental layer 121. The layer 121 may be formed directly onto the layer 11b, for example by thermal oxidation, or by other means (for example deposition). The first elemental layer is produced from the first material defined above, namely $SiO_2$ in the present example.

Figure 3B:
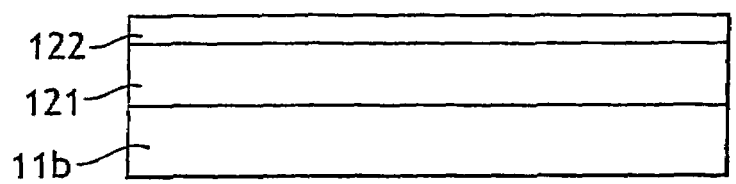
Figure 3C:
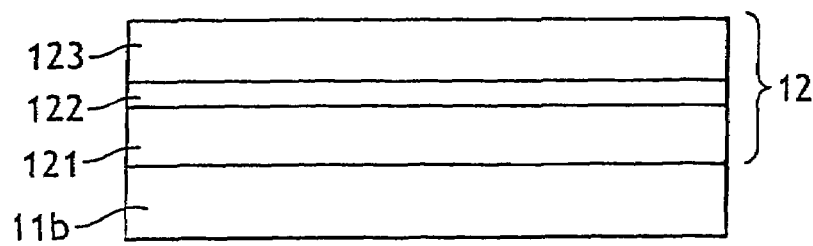

FIG. 3b shows the formation of a second elemental layer 122, by covering the first elemental layer 121. This second elemental layer 122 is produced from the enrichment material mentioned above, namely the second material (Si or Ge, for example), or a precursor for the second material. The layer 122 thus corresponds to the enriched region of the connecting layer. The second elemental layer 122 can be deposited on the layer 121, if desired. A third elemental layer 123 is then formed on the surface of the layer 122, which third elemental layer is produced from the same material as the first elemental layer 121. The third elemental layer can be produced by deposition onto the second elemental layer. It should be pointed out that other methods for associating the layer 123 with the layer 122 can also be envisaged (thermal oxidation, bonding, etc). In the case in which the layer 123 is produced on the layer 122 using a technique such as thermal oxidation, which involves consumption of part of the material of the subjacent layer 122 (consumption of part of the Si of layer 122 to form the $SiO_2$ of layer 123), the thickness of the layer 122 will have been gauged so that its thickness is sufficient to provide the material necessary to carry out the technique for producing the layer 123.

Figure 3D:
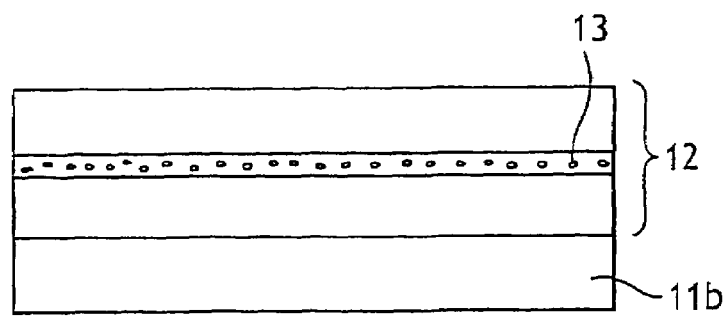

By the successive formation of the three elemental layers 121, 122, 123, a layer 12 is thus created in which the layer 122 corresponds to the enriched region. Heat treatment is then carried out to cause segregation in the enriched region, as was the case for the first implementation described above. This forms a structure as shown in FIG. 3d, in which the connecting layer 12 comprises a zone for concentrating nanoparticles 13 of the second material, following the segregation heat treatment.

It should be pointed out that in this second implementation of the invention, it is possible to dispense with the first elemental layer 121 and/or the third elemental layer 123. Overall, then, in the second implementation, it is possible to produce several structural configurations, depending on the number of elemental layers in the connecting layer (1, 2 or 3 elemental layers).

Figure 4A:
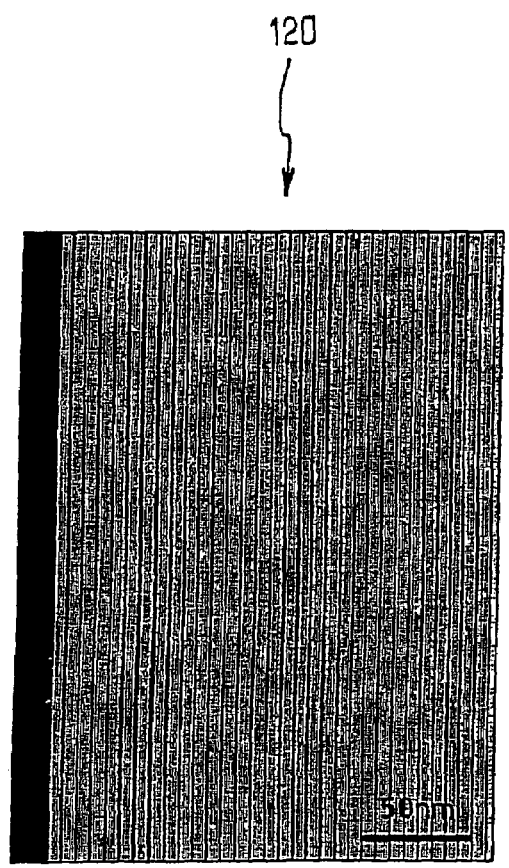
FIGS. 4a and 4b show the effect of a heat treatment which can cause nanoparticle segregation and which can be used in the invention.
Figure 4B:
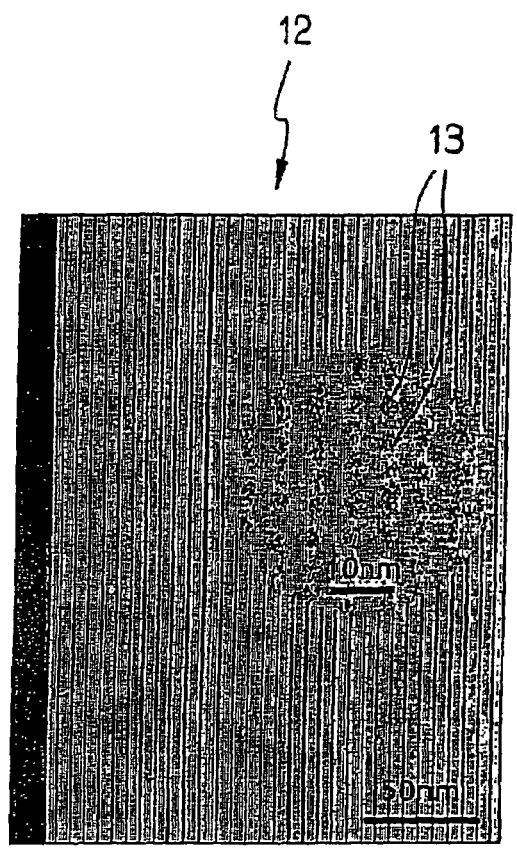

FIGS. 4a and 4b originate from an article by M. Zacharias et al, published in Applied Physics Letters, 80 (4), 2002, p 661. More particularly, these figures show the state of the layer corresponding to the connecting layer prior to segregation heat treatment (enriched region 120 of FIG. 4a) and after the treatment (region of the finished connecting layer 12 which comprises the nanoparticle concentration zone, in FIG. 4b). The scales are shown in the bottom right hand corners of the two figures.

FIG. 4a thus shows an enriched region 120 composed of $SiO_2$ enriched with silicon atoms. This enriched region 120 may, for example, have been formed as follows:

by implanting silicon into an initial layer of $SiO_2$ (first implementation of the invention); or by forming an elemental layer which corresponds to the region 120 (second implementation of the invention).

In all cases, a silicon-enriched layer with the following mean composition is formed within the thickness of a layer of $SiO_2$: $Si_{(1-x)}O_x$, in which X is in the range 0 to 0.68. This figure shows that the SiO is diffused into the mass of the layer 120.

FIG. 4b shows the same region of the section after a segregation anneal at 1100° C. for a period of one hour in a neutral nitrogen atmosphere. This figure shows that the SiO is no longer present in the diffused state. In contrast, the magnified section of this figure highlights discrete aggregates which are separated from each other. The aggregates correspond to silicon nanoparticles in the $SiO_2$, which corresponds to the base material for the connecting layer 12 ("first material"). The nanoparticles constitute discrete points of weakness which allow good local detachment at the layer 12. In contrast, the configuration after segregation is extremely stable as regards heat treatments which may be carried out before detaching the layer 12 (and more generally a substrate 10 comprising the layer 12).

The segregation heat treatment preferably uses the following segregation equation:

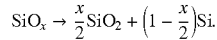

In the case in which x=1, this equation corresponds to segregation of SiO into $SiO_2$ and Si.

Figure 5:
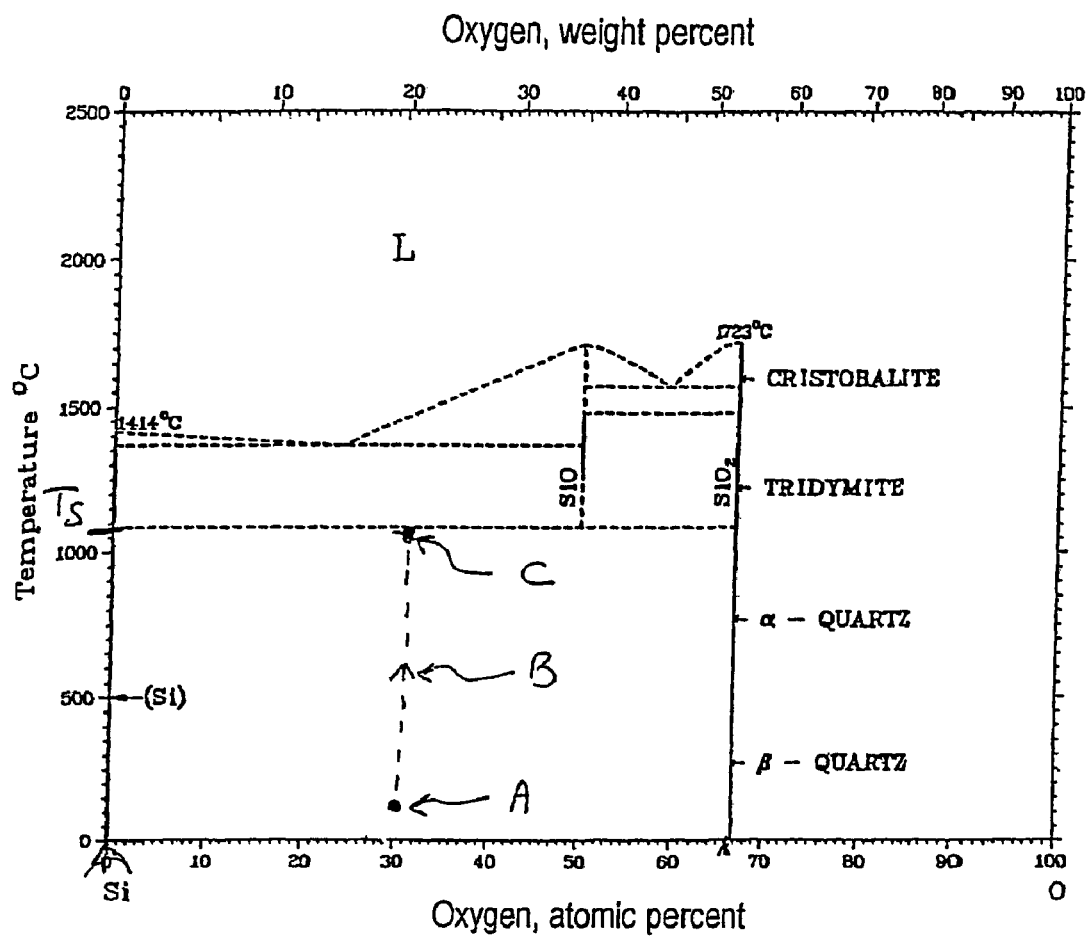
FIG. 5 is a phase diagram showing different Si, SiO and $SiO_2$ domains as a function of temperature, showing a thermodynamic change which can be exploited in the context of the invention.

As explained with reference to FIG. 5, subsequent heat treatments do not affect the general configuration of the nanoparticle concentration zone in the "first material" of the connecting layer 12. FIG. 5 shows a phase diagram indicating stable domains for various silicon compounds. FIG. 5 shows, as a function of temperature (up the ordinate), the stability domains of Si, SiO and $SiO_2$ (the abscissa shows the percentage of oxygen in the Si). It can be seen that below a temperature Ts, termed the segregation temperature, Si, SiO and $SiO_2$ can co-exist without segregation. In the case of silicon, the segregation temperature is slightly below 1100° C.

Beyond this temperature Ts, the Si and $SiO_2$ phases separate by segregation. SiO does not have a stable state beyond this temperature. The invention astutely exploits these properties. This is achieved during segregation heat treatment, illustrated by the changes between points A and C in FIG. 5:

the starting point for the segregation heat treatment corresponds to point A. The point corresponds to a state at ambient temperature at which an enriched region 120, which can be produced from silicon-enriched $SiO_2$, has been formed;

the temperature is then raised to a temperature B which corresponds to segregation heat treatment. This temperature increase causes the Si or SiO present in the $SiO_2$ to segregate from the $SiO_2$. During the heat treatment, the temperature is increased to the segregation temperature Ts;

once the temperature Ts is reached (point C), segregation between the Si or SiO on the one hand and the $SiO_2$ on the other hand is complete and the Si or SiO which was present in the diffused state in the $SiO_2$ is aggregated into Si nanoparticles.

Furthermore, subsequent heat treatments do not modify the nanoparticle configuration, as the segregation reaction is not reversible.

Thus, a release substrate fabricated using the technique has a substantially constant energy between its release layers, regardless of the heat treatments which such a substrate undergoes prior to releasing. The implementations of the invention offer a number of possibilities:

the possibility of carrying out surface treatments (e.g., planarization, etc) on the various layers prior to bonding those layers;

the possibility of carrying out the segregation heat treatment at different stages of the method:

immediately after forming the enriched layer (it should be recalled that in the context of the second implementation, this enriched layer corresponds to the elemental layer 122);

after the connecting layer has been finalized and prior to forming the release layer 11a on the connecting layer (for example after implanting enrichment material in the first implementation, or after forming the ensemble of elemental layers in the second implementation);

after forming the release layer 11a on the connecting layer;

(it is possible to split the segregation heat treatment into several heat treatment steps carried out at several of the stages mentioned above—any combination of modes of implementing the segregation heat treatment steps is possible);

the possibility of cleaning the surface of the exposed layers between each step;

the possibility of implementing different types of techniques to form release layers 11a and 11b of the desired thickness:

transfer methods—in particular of the SMART-CUT® type employing one or more weakening implantation steps using one or more species, bonding and detachment at the implanted zone;

in this respect, the layer 11b can be formed:

a prior to forming the connecting layer (and the layer 11b can be formed on a temporary stiffener if its thickness does not allow it to be treated without a support means);

a or after forming the connecting layer, by transfer onto the lower face (that facing the bottom of the figures) of the connecting layer of a substrate weakened by implantation in which the thin layer bonded to the connecting layer will correspond to the layer 11b after detachment of the substrate at the implanted zone;

the layer 11a which is then formed on the connecting layer can itself be formed by bonding a substrate weakened by implantation onto an intermediate structure composed of the layer 11b and the connecting layer, then detachment of the substrate at the implanted zone to leave on the intermediate structure only the portion of the implanted substrate corresponding to the layer 11a;

BESOI type methods employing bonding and removal of material from the back face (which can be carried out to form the layer 11a on the already formed connecting layer);

the possibility of using different materials to produce the first elemental layer 121 and/or the third elemental layer 123 (in the context of the second implementation): not only $SiO_2$, but also materials such as $Si_3N_4$ can be employed.

The skilled artisan of course recognizes that the SMART-CUT® technique is well known layer transfer technique that is published in various documents including the article by A. J. Auberton-Herve et al entitled "Why Can SMART-CUT® Change the Future of Microelectronics?", International Journal of High Speed Electronics and Systems, Vol. 10, no. 1, 2000, pages 131-146. Generally, this layer transfer technique comprises implantation of ions in a source substrate to form a weakened zone followed by bonding of the source substrate to a substrate that is to receive the layer, followed by detachment of the layer from the source substrate at the weakened zone to transfer it to the receiving substrate.

Also, the term "deposition" as used herein can include epitaxial growth of a semiconductor material or CVD or other layer deposition processes.

What is claimed is:

1. A method of fabricating a release substrate of semiconductor materials, which comprises forming a reversible connection between two substrate release layers by providing a connecting layer of a first material, and providing a concentrated zone of nanoparticles of a second material in the connecting layer as a first substrate release layer to facilitate release of the substrate release layers, with the connecting layer having a bonding energy that is substantially constant even when the release substrate is exposed to heat treatment, wherein the connecting layer is formed by:

provide a first elemental layer of the first material adjacent the first substrate release layer;

forming an enriched layer by providing a second elemental layer of the second material or a precursor for the second material on the surface of the first elemental layer;

further providing a third elemental layer of the first material on the surface of the enriched layer; and heat treating the enriched layer to cause segregation of nanoparticles of the second material thus forming a second release layer.

2. The method of claim 1, wherein the enriched layer is produced by deposition onto the first elemental layer.

3. The method of claim 1, wherein the first elemental layer is produced by deposition onto a first substrate release layer.

4. The method of claim 3, wherein the first elemental layer is produced by thermal oxidation of a portion of the first substrate release layer.

5. The method of claim 1, wherein the third elemental layer of first material is produced by deposition onto the enriched layer.

6. The method of claim 1, wherein the enriched layer has a thickness sufficient to produce the third elemental layer of first material by thermal oxidation of a portion of the thickness of the enriched layer.

7. The method of claim 1, wherein the third elemental layer of the first material is provided by:

forming a further elemental layer of the first material on the second release layer; and bonding the further elemental layer on the second substrate release layer to the surface of the enriched layer.

8. The method of claim 7, wherein the further elemental layer of first material is produced by thermal oxidation of a portion of the second substrate release layer prior to joining the second release layer to the surface of the enriched layer.

9. The method of claim 1, wherein the concentrated zone of nanoparticles of the second material is provided by carrying out a segregation heat treatment of the connecting layer at a temperature on the order of 900° C. to 1100° C. for a sufficient time to form the nanoparticles and the bonding energy of the connecting layer does not weaken when the substrate is exposed to heat treatment.

10. The method of claim 9 wherein the segregation heat treatment is conducted for about 25 to 95 minutes, optionally in an inert atmosphere of nitrogen, argon or mixtures thereof.

11. The method of claim 1, wherein the second release layer is formed on the connecting layer after creating an enriched region in the connecting layer.

12. The method of claim 1, wherein at least one release layer is provided by a layer transfer technique.

13. The method of claim 12, wherein the layer transfer technique comprises implantation of ions in a source substrate to form a weakened zone followed by bonding of the source substrate to the connecting layer, then followed by detachment of the that release layer from the source substrate at the weakened zone.

14. The method of claim 13, wherein at least one other release layer is provided by a layer transfer technique.

15. The method of claim 14, wherein the layer transfer technique for the other release layer comprises implantation of ions in a source substrate to form a weakened zone followed by bonding of the source substrate to the connecting layer, then followed by detachment of the previous release layer from the source substrate at the weakened zone.

16. The method of claim 1, wherein the first material is $SiO_2$.

17. The method of claim 1, wherein the second material is Si.

18. The method of claim 1, wherein the enrichment material is SiO.

19. The method of claim 1, wherein the second material is Ge.

20. The method of claim 1, wherein the enriched region is produced by implanting the enrichment material into the initial layer.

* * * * *